United States Patent
Hwang et al.

(10) Patent No.: US 12,451,886 B2
(45) Date of Patent: Oct. 21, 2025

(54) BUFFER CIRCUIT CAPABLE OF REDUCING NOISE

(71) Applicant: SK hynix Inc., Icheon-si (KR)

(72) Inventors: Jin Ha Hwang, Icheon-si (KR); Soon Sung An, Icheon-si (KR); Junseo Jang, Icheon-si (KR); Jaehyeong Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 56 days.

(21) Appl. No.: 18/516,615

(22) Filed: Nov. 21, 2023

(65) Prior Publication Data
US 2024/0097685 A1   Mar. 21, 2024

Related U.S. Application Data (62) Division of application No. 17/514,789, filed on Oct. 29, 2021, now Pat. No. 11,843,373.

(30) Foreign Application Priority Data

Jun. 24, 2021 (KR) .......................... 10-2021-0082019

(51) Int. Cl.
*H03K 19/0185* (2006.01)
*H03K 19/003* (2006.01)

(52) U.S. Cl.
CPC ............... *H03K 19/018521* (2013.01); *H03K 19/00361* (2013.01)

(58) Field of Classification Search
CPC ..... H03K 19/018521; H03K 19/00361; H03K 19/00346; H03K 19/0175; H03K 19/0185; H03K 19/0016
See application file for complete search history.

(56) References Cited

U.S. PATENT DOCUMENTS

| | | |
|---|---|---|
| 6,448,830 B1 | 9/2002 | Chuang et al. |
| 9,881,669 B1 | 1/2018 | Bringivijayaraghavan et al. |
| 2005/0073348 A1* | 4/2005 | Hinterscher ............ H03K 5/08 327/309 |
| 2010/0097117 A1 | 4/2010 | Wang et al. |
| 2018/0083625 A1 | 3/2018 | Garg |

FOREIGN PATENT DOCUMENTS

| KR | 1019990069650 A | 9/1999 |
|---|---|---|
| KR | 100695001 B1 | 3/2007 |
| KR | 1020110078661 A | 7/2011 |

* cited by examiner

*Primary Examiner* — Daniel D Chang
(74) *Attorney, Agent, or Firm* — WILLIAM PARK & ASSOCIATES LTD.

(57) ABSTRACT

A buffer circuit includes a power control circuit, an inverting circuit, and a voltage adjustment circuit. The power control circuit is configured to provide voltages based on an input signal and a mode signal, and the inverting circuit is configured to receive and invert the voltages to generate an output signal. The voltage adjustment circuit is configured to adjust voltage levels based on the mode signal and the output signal.

5 Claims, 3 Drawing Sheets

BUFFER CIRCUIT CAPABLE OF REDUCING NOISE

CROSS-REFERENCES TO RELATED APPLICATION

The U.S. non-provisional patent is a divisional application of U.S. patent application Ser. No. 17/514,789, filed on Oct. 29, 2021, which claims priority under 35 U.S.C. § 119(a) to Korean application number 10-2021-0082019, filed on Jun. 24, 2021, in the Korean Intellectual Property Office, which is incorporated herein by reference in its entirety.

BACKGROUND

1. Technical Field

Various embodiments generally relate to a semiconductor technology, and more particularly, to a buffer circuit capable of reducing noise.

2. Related Art

An electronic device may include many electronic components, and among them, a computer system that includes many semiconductor apparatuses that are composed of semiconductors. The semiconductor apparatuses, constituting the computer system, may communicate with each other by transmitting and receiving a clock signal and data. The semiconductor apparatuses may include a buffer circuit that generates an output signal by amplifying and/or buffering an input signal. A general buffer circuit may be a differential amplifier that generates an output signal by differentially amplifying a positive input signal and a negative input signal. A glitch refers to an unintentional noise pulse in a digital signal, and the glitch causes an erroneous output or a temporary abnormal operation of a digital system. Thus, many methods for filtering the glitch have been studied.

SUMMARY

A buffer circuit according to an embodiment of the present disclosure may include: a power control circuit configured to provide a first voltage and a second voltage based on an input signal and a mode signal; an inverting circuit configured to receive the first voltage and the second voltage and configured to invert the input signal to generate an output signal; and a voltage adjustment circuit configured to select one of a first power supply voltage and a second power supply voltage based on the output signal and the mode signal, and to adjust voltage levels of the first voltage and the second voltage.

A buffer circuit according to an embodiment of the present disclosure may include: a power control circuit configured to provide a first power supply voltage and a second power supply voltage as a first voltage and a second voltage according to an input signal in a first operation mode and configured to provide the first power supply voltage and the second power supply voltage as the first voltage and the second voltage, regardless of the input signal, in a second operation mode; an inverting circuit configured to receive the first voltage and the second voltage in the first operation mode and the second operation mode and configured to invert the input signal to generate an output signal; and a voltage adjustment circuit configured to: provide the second power supply voltage as the first voltage and provide the first power supply voltage as the second voltage based on the output signal in the first operation mode, and provide the first power supply voltage as the first voltage and provide the second power supply voltage as the second voltage based on the output signal in the second operation mode.

An enable signal generation circuit according to an embodiment of the present disclosure may include: a buffer circuit configured to invert an input signal to generate an output signal with a voltage level that varies between a first voltage and a second voltage, configured to adjust voltage levels of the first voltage and the second voltage based on the input signal and the output signal in a first operation mode, and configured to substantially maintain the voltage levels of the first voltage and the second voltage, regardless of the input signal, in a second operation mode; a delay circuit configured to delay the output signal and generate a delayed output signal; and a trigger circuit configured to generate an enable signal based on the output signal and the delayed output signal.

An enable signal generation circuit according to an embodiment of the present disclosure may include: a first buffer circuit configured to invert an input signal to generate an output signal with a voltage level that varies between a first voltage and a second voltage, to adjust voltage levels of the first voltage and the second voltage based on the input signal and the output signal in a first operation mode, and to substantially maintain the voltage levels of the first voltage and the second voltage, regardless of the input signal, in a second operation mode; and a second buffer circuit configured to invert the output signal to generate an enable signal with a voltage level that varies between the first voltage and the second voltage, configured to adjust the voltage levels of the first voltage and the second voltage based on the output signal and the enable signal in the first operation mode, and configured to substantially maintain the voltage levels of the first voltage and the second voltage, regardless of the output signal, in the second operation mode.

DETAILED DESCRIPTION

Figure 1:
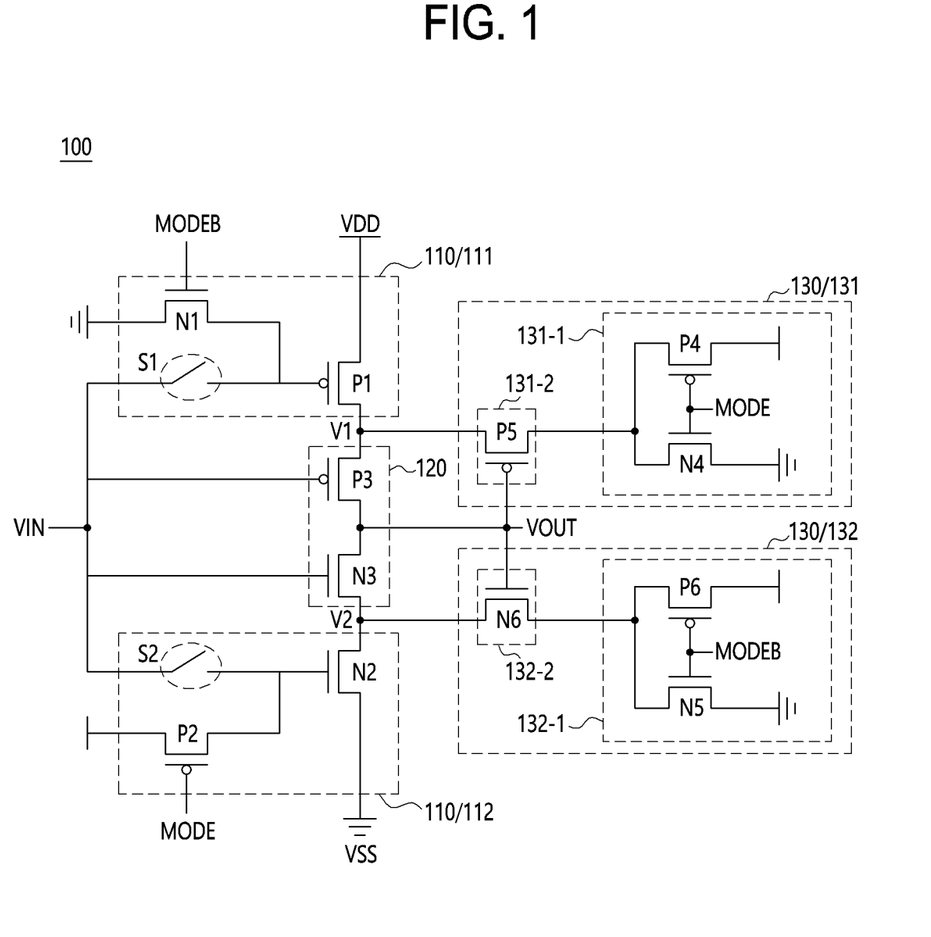
FIG. 1 is a diagram illustrating a configuration of a buffer circuit in accordance with an embodiment of the present disclosure.

FIG. 1 is a diagram illustrating a configuration of a buffer circuit 100 in accordance with an embodiment of the present disclosure. Referring to FIG. 1, the buffer circuit 100 may receive an input signal VIN and a mode signal MODE and may generate an output signal VOUT. The mode signal MODE may be any operation signal that operates an internal circuit of the buffer circuit 100. When a glitch and/or noise frequently occurs in the input signal VIN, the mode signal MODE may be enabled. When a glitch and/or noise occurs relatively less often in the input signal VIN, the mode signal MODE may be disabled.

The buffer circuit 100 may generate a first voltage V1 and a second voltage V2 based on the input signal VIN and the mode signal MODE, receive the first voltage V1 and the second voltage V2, and invert the input signal VIN to generate the output signal VOUT. The second voltage V2 may have a voltage level that is lower than that of the first voltage V1. The buffer circuit 100 may adjust the voltage levels of the first voltage V1 and the second voltage V2 based on the mode signal MODE and the output signal VOUT. For example, the voltage levels of the first voltage V1 and the second voltage V2 may be adjusted by a potential difference (hysteresis voltage) of a Schmitt trigger inverter circuit. The first voltage V1 may be a voltage that determines a lower triggering point (LTP) of the Schmitt trigger inverter. The second voltage V2 may be a voltage that determines an upper triggering point (UTP) of the Schmitt trigger inverter.

When a glitch and/or noise frequently occurs in the input signal VIN, the mode signal MODE may be enabled. When the mode signal MODE is enabled, the buffer circuit 100 may provide power supply voltages VDD and VSS as the first voltage V1 and the second voltage V2 according to the logic level of the input signal VIN. The buffer circuit 100 may adjust the voltage levels of the first voltage V1 and the second voltage V2 when the mode signal MODE is enabled, thereby stabilizing the voltage level of the output signal VOUT even though a glitch and/or noise occurs in the input signal VIN. Furthermore, when a glitch and/or noise occurs relatively less often in the input signal VIN, the mode signal MODE may be disabled. When the mode signal MODE is disabled, the buffer circuit 100 may provide the power supply voltages VDD and VSS as the first voltage V1 and the second voltage V2, regardless of the logic level of the input signal VIN. Accordingly, the first voltage V1 may be substantially maintained at a voltage level that corresponds to a first power supply voltage VDD, and the second voltage V2 may be substantially maintained at a voltage level that corresponds to a second power supply voltage VSS, so that the buffer circuit 100 may quickly generate the output signal VOUT from the input signal VIN without delay.

The buffer circuit 100 may include a power control circuit 110, an inverting circuit 120, and a voltage adjustment circuit 130.

The power control circuit 110 may provide the first voltage V1 and the second voltage V2 based on the mode signal MODE and the input signal VIN.

When the mode signal MODE is enabled, the power control circuit 110 may provide the first power supply voltage VDD and the second power supply voltage VSS as the first voltage V1 and the second voltage V2 according to the logic level of the input signal VIN. When the mode signal MODE is disabled, the power control circuit 110 may provide the first power supply voltage VDD and the second power supply voltage VSS as the first voltage V1 and the second voltage V2, regardless of the logic level of the input signal VIN.

The power control circuit 110 may include a first power control circuit 111 and a second power control circuit 112.

The first power control circuit 111 may generate the first voltage V1 based on the input signal VIN and a complementary signal MODEB of the mode signal MODE.

The first power control circuit 111 may provide the first power supply voltage VDD as the first voltage V1 according to whether the mode signal MODE is enabled. For example, when the mode signal MODE is enabled, the first power control circuit 111 may provide the first power supply voltage VDD as the first voltage V1 according to the logic level of the input signal VIN. When this occurs, the first voltage V1 may be a voltage that determines the LTP of the Schmitt trigger inverter. When the mode signal MODE is enabled and the input signal VIN is at a logic low level, the first power control circuit 111 may provide the first power supply voltage VDD as the first voltage V1. When the mode signal MODE is enabled and the input signal VIN is at a logic high level, the first power control circuit 111 may provide the second power supply voltage VSS as the first voltage V1. When the mode signal MODE is disabled, the first power control circuit 111 may provide the first power supply voltage VDD as the first voltage V1, regardless of the logic level of the input signal VIN.

The first power control circuit 111 may include a first switch S1, a first P channel MOS transistor P1, and a first N channel MOS transistor N1.

One end of the first switch S1 may receive the input signal VIN, and the other end of the first switch S1 may be connected to the gate of the first P channel MOS transistor P1. The first switch S1 may selectively provide the input signal VIN to the first P channel MOS transistor P1 based on the mode signal MODE. When the mode signal MODE is enabled to a logic high level and the first switch S1 is turned on, the input signal VIN may be inputted to the first P channel MOS transistor P1 as a gate voltage. The source of the first P channel MOS transistor P1 may receive the first power supply voltage VDD, the gate of the first P channel MOS transistor P1 may be connected to the other end of the first switch S1, and the drain of the first P channel MOS transistor P1 may be connected to a node of the first voltage V1. The first P channel MOS transistor P1 may be selectively turned on according to the gate voltage level to provide the first power supply voltage VDD as the first voltage V1. The source of the first N channel MOS transistor N1 may receive the second power supply voltage VSS, the gate of the first N channel MOS transistor N1 may receive the complementary signal MODEB of the mode signal MODE, and the drain of the first N channel MOS transistor N1 may be connected to the gate of the first P channel MOS transistor P1. When the mode signal MODE is disabled to a logic low level and the first switch S1 is turned off, the first N channel MOS transistor N1 may provide the second power supply voltage VSS to the gate of the first P channel MOS transistor P1 in response to the complementary signal MODEB of the mode signal MODE.

The second power control circuit 112 may generate the second voltage V2 based on the input signal VIN and the mode signal MODE.

The second power control circuit 112 may provide the second power supply voltage VSS as the second voltage V2 according to whether the mode signal MODE is enabled. For example, when the mode signal MODE is enabled, the second power control circuit 112 may provide the second power supply voltage VSS as the second voltage V2 according to the logic level of the input signal VIN. When this occurs, the second voltage V2 may be a voltage that determines the UTP of the Schmitt trigger inverter. When the mode signal MODE is enabled and the input signal VIN is at a logic high level, the second power control circuit 112 may provide the second power supply voltage VSS as the second voltage V2. When the mode signal MODE is enabled and the input signal VIN is at a logic low level, the second power control circuit 112 may provide the first power supply voltage VDD as the second voltage V2. When the mode signal MODE is disabled, the second power control circuit 112 may provide the second power supply voltage VSS as the second voltage V2, regardless of the logic level of the input signal VIN.

The second power control circuit 112 may include a second switch S2, a second P channel MOS transistor P2, and a second N channel MOS transistor N2.

One end of the second switch S2 may receive the input signal VIN, and the other end of the second switch S2 may be connected to the gate of the second N channel MOS transistor N2. The second switch S2 may selectively provide the input signal VIN to the second N channel MOS transistor N2 based on the mode signal MODE. When the mode signal MODE is enabled to a logic high level and the second switch S2 is turned on, the input signal VIN may be inputted to the second N channel MOS transistor N2 as a gate voltage. The source of the second N channel MOS transistor N2 may receive the second power supply voltage VSS, the gate of the second N channel MOS transistor N2 may be connected to the other end of the second switch S2, and the drain of the second N channel MOS transistor N2 may be connected to a node of the second voltage V2. The second N channel MOS transistor N2 may be selectively turned on according to the gate voltage level to provide the second power supply voltage VSS as the second voltage V2. The source of the second P channel MOS transistor P2 may receive the first power supply voltage VDD, the gate of the second P channel MOS transistor P2 may receive the mode signal MODE, and the drain of the second P channel MOS transistor P2 may be connected to the gate of the second N channel MOS transistor N2.

When the mode signal MODE is disabled to a logic low level, the second switch S2 may be turned off and the second P channel MOS transistor P2 may provide the first power supply voltage VDD to the gate of the second N channel MOS transistor N2 in response to the mode signal MODE.

The inverting circuit 120 may receive the input signal VIN and may invert the input signal VIN to generate the output signal VOUT.

The inverting circuit 120 may output the second voltage V2 as the output signal VOUT when the voltage level of the input signal VIN is a logic high level. The inverting circuit 120 may output the first voltage V1 as the output signal VOUT when the voltage level of the input signal VIN is a logic low level.

The inverting circuit 120 may include a third P channel MOS transistor P3 and a third N channel MOS transistor N3.

The source of the third P channel MOS transistor P3 may receive the first voltage V1, the gate of the third P channel MOS transistor P3 may receive the input signal VIN, and the drain of the third P channel MOS transistor P3 may be connected to the drain of the third N channel MOS transistor N3. The source of the third N channel MOS transistor N3 may receive the second voltage V2, the gate of the third N channel MOS transistor N3 may receive the input signal VIN, and the drain of the third N channel MOS transistor N3 may be connected to the drain of the third P channel MOS transistor P3. The third P channel MOS transistor P3 and the third N channel MOS transistor N3 may be selectively turned on according to the voltage level of the input signal VIN, thereby outputting the first voltage V1 and the second voltage V2 as the output signal VOUT.

The third P channel MOS transistor P3 may be turned on when the voltage level of the input signal VIN is a logic low level. When the third P channel MOS transistor P3 is turned on, the third P channel MOS transistor P3 may output the first voltage V1 to the drain of the third P channel MOS transistor P3 as the output signal VOUT. The third N channel MOS transistor N3 may be turned on when the voltage level of the input signal VIN is a logic high level. When the third N channel MOS transistor N3 is turned on, the third N channel MOS transistor N3 may output the second voltage V2 to the drain of the third N channel MOS transistor N3 as the output signal VOUT.

The voltage adjustment circuit 130 may adjust the voltage levels of the first voltage V1 and the second voltage V2 based on the mode signal MODE and the output signal VOUT.

The voltage adjustment circuit 130 may be activated according to the logic level of the output signal VOUT. When the voltage adjustment circuit 130 is activated, the voltage adjustment circuit 130 may provide the first power supply voltage VDD and the second power supply voltage VSS as the first voltage V1 and the second voltage V2 according to whether the mode signal MODE is enabled. When the voltage adjustment circuit 130 is activated and the mode signal MODE is enabled, the voltage adjustment circuit 130 may adjust the voltage levels of the first voltage V1 and the second voltage V2. When the output signal VOUT is at a logic low level and the mode signal MODE is enabled, the voltage adjustment circuit 130 may provide the second power supply voltage VSS as the first voltage V1 to lower the voltage level of the first voltage V1. When the output signal VOUT is at a logic low level and the mode signal MODE is disabled, the voltage adjustment circuit 130 may provide the first power supply voltage VDD as the first voltage V1 to substantially maintain the voltage level of the first voltage V1 at the voltage level the first power supply voltage VDD. When the output signal VOUT is at a logic high level and the mode signal MODE is enabled, the voltage adjustment circuit 130 may provide the first power supply voltage VDD as the second voltage V2 to raise the voltage level of the second voltage V2. When the output signal VOUT is at a logic high level and the mode signal MODE is disabled, the voltage adjustment circuit 130 may provide the second power supply voltage VSS as the second voltage V2 to substantially maintain the voltage level of the second voltage V2 at the voltage level of the second power supply voltage VSS.

The voltage adjustment circuit 130 may include a first voltage adjustment circuit 131 and a second voltage adjustment circuit 132.

The first voltage adjustment circuit 131 may receive the output signal VOUT and the mode signal MODE to adjust the first voltage V1.

The first voltage adjustment circuit 131 may be deactivated when the output signal VOUT is at a logic high level. When the first voltage adjustment circuit 131 is deactivated, the first voltage adjustment circuit 131 might not adjust the voltage level of the first voltage V1.

The first voltage adjustment circuit 131 may be activated when the output signal VOUT is at a logic low level. When the first voltage adjustment circuit 131 is activated and the mode signal MODE is enabled, the first voltage adjustment circuit 131 may provide the second power supply voltage VSS as the first voltage V1 to lower the voltage level of the first voltage V1. When the first voltage adjustment circuit 131 is activated and the mode signal MODE is disabled, the first voltage adjustment circuit 131 may provide the first power supply voltage VDD as the first voltage V1 to substantially maintain the voltage level of the first voltage V1 at the voltage level of the first power supply voltage VDD.

The first voltage adjustment circuit 131 may include a first power selection circuit 131-1 and a first switch circuit 131-2. The first power selection circuit 131-1 may select the first power supply voltage VDD or the second power supply voltage VSS according to the logic level of the mode signal MODE and may output the selected voltage to the first switch circuit 131-2. The first switch circuit 131-2 may receive the first power supply voltage VDD or the second power supply voltage VSS and may provide the first power supply voltage VDD or the second power supply voltage VSS as the first voltage V1. The first power selection circuit 131-1 may include a fourth P channel MOS transistor P4 and a fourth N channel MOS transistor N4.

The source of the fourth P channel MOS transistor P4 may receive the first power supply voltage VDD, and the gate of the fourth P channel MOS transistor P4 may receive the mode signal MODE. The source of the fourth N channel MOS transistor N4 may receive the second power supply voltage VSS, and the gate of the fourth N channel MOS transistor N4 may receive the mode signal MODE. Drains of the fourth P channel MOS transistor P4 and the fourth N channel MOS transistor N4 may be connected to the first switch circuit 131-2.

The first power selection circuit 131-1 may output one of the first power supply voltage VDD and the second power supply voltage VSS to the first switch circuit 131-2 according to the logic level of the mode signal MODE. When the mode signal MODE is enabled, the first power selection circuit 131-1 may output the second power supply voltage VSS to the first switch circuit 131-2. When the mode signal MODE is disabled, the first power selection circuit 131-1 may output the first power supply voltage VDD to the first switch circuit 131-2.

The first switch circuit 131-2 may include a fifth P channel MOS transistor P5. The source of the fifth P channel MOS transistor P5 may be connected in common to the drains of the fourth P channel MOS transistor P4 and the fourth N channel MOS transistor N4 and may receive the output of the first power selection circuit 131-1, the gate of the fifth P channel MOS transistor P5 may receive the output signal VOUT, and the drain of the fifth P channel MOS transistor P5 may be connected to the node of the first voltage V1. The fifth P channel MOS transistor P5 may receive the first power supply voltage VDD or the second power supply voltage VSS, which is outputted from the first power selection circuit 131-1, and may provide the received voltage as the first voltage V1.

The second voltage adjustment circuit 132 may receive the output signal VOUT and the complementary signal MODEB of the mode signal MODE to adjust the second voltage V2.

The second voltage adjustment circuit 132 may be deactivated when the output signal VOUT is at a logic low level. When the second voltage adjustment circuit 132 is deactivated, the second voltage adjustment circuit 132 might not adjust the voltage level of the second voltage V2.

The second voltage adjustment circuit 132 may be activated when the output signal VOUT is at a logic high level. When the second voltage adjustment circuit 132 is activated and the complementary signal MODEB of the mode signal MODE is enabled, the second voltage adjustment circuit 132 may provide the first power supply voltage VDD as the second voltage V2 to raise the voltage level of the second voltage V2. When the second voltage adjustment circuit 132 is activated and the complementary signal MODEB of the mode signal MODE is disabled, the second voltage adjustment circuit 132 may provide the second power supply voltage VSS as the second voltage V2 to substantially maintain the voltage level of the second voltage V2 without adjusting the voltage level of the second voltage V2.

The second voltage adjustment circuit 132 may include a second power selection circuit 132-1 and a second switch circuit 132-2. The second power selection circuit 132-1 may select the first power supply voltage VDD or the second power supply voltage VSS according to the logic level of the complementary signal MODEB of the mode signal MODE and may output the selected voltage to the second switch circuit 132-2. The second switch circuit 132-2 may receive the first power supply voltage VDD or the second power supply voltage VSS and provide the first power supply voltage VDD or the second power supply voltage VSS as the second voltage V2. The second power selection circuit 132-1 may include a sixth P channel MOS transistor P6 and a fifth N channel MOS transistor N5.

The source of the sixth P channel MOS transistor P6 may receive the first power supply voltage VDD, and the gate of the sixth P channel MOS transistor P6 may receive the complementary signal MODEB of the mode signal MODE. The source of the fifth N channel MOS transistor N5 may receive the second power supply voltage VSS, and the gate of the fifth N channel MOS transistor N5 may receive the complementary signal MODEB of the mode signal MODE. Drains of the sixth P channel MOS transistor P6 and the fifth N channel MOS transistor N5 may be connected to the second switch circuit 132-2. The second power selection circuit 132-1 may output one of the first power supply voltage VDD and the second power supply voltage VSS to the second switch circuit 132-2 according to the logic level of the complementary signal MODEB of the mode signal MODE. When the complementary signal MODEB of the mode signal MODE is enabled, the second power selection circuit 132-1 may output the first power supply voltage VDD to the second switch circuit 132-2. When the complementary signal MODEB of the mode signal MODE is disabled, the second power selection circuit 132-1 may output the second power supply voltage VSS to the second switch circuit 132-2.

The second switch circuit 132-2 may include a sixth N channel MOS transistor N6. The source of the sixth N channel MOS transistor N6 may be connected in common to the drains of the sixth P channel MOS transistor P6 and the fifth N channel MOS transistor N5 and may receive the output of the second power selection circuit 132-1, the gate of the sixth N channel MOS transistor N6 may receive the output signal VOUT, and the drain of the sixth N channel MOS transistor N6 may be connected to the node of the second voltage V2. The sixth N channel MOS transistor N6 may receive the first power supply voltage VDD or the second power supply voltage VSS, which is outputted from the second power selection circuit 132-1, and may provide the received voltage as the second voltage V2.

An operation of the buffer circuit 100, in accordance with an embodiment of the present disclosure, will be described as follows with reference to FIG. 1. For example, when a glitch and/or noise frequently occurs in the input signal VIN, the mode signal MODE is enabled so that the buffer circuit 100 may operate in a first operation mode. The first operation mode may be a mode in which the buffer circuit 100 operates as the Schmitt trigger inverter. Furthermore, when a glitch and/or noise occurs relatively less often in the input signal VIN, the mode signal MODE is disabled so that the buffer circuit 100 may operate in a second operation mode. The second operation mode may be a mode in which the buffer circuit 100 operates as a general inverter.

When the buffer circuit 100 operates in the first operation mode, the buffer circuit 100 may provide the first power supply voltage VDD and the second power supply voltage VSS as the first voltage V1 and the second voltage V2, respectively, according to the logic level of the input signal VIN.

When the buffer circuit 100 operates in the first operation mode and the input signal VIN is at a logic low level, the output signal VOUT may be at a logic high level. When this occurs, the first voltage adjustment circuit 131 may be deactivated and the second voltage adjustment circuit 132 may be activated. The second voltage adjustment circuit 132 may receive the complementary signal MODEB of the mode signal MODE and may provide the first power supply voltage VDD as the second voltage V2 through the second power selection circuit 132-1, thereby raising the voltage level of the second voltage V2. When this occurs, the second voltage V2 may be a voltage that determines the UTP of the Schmitt trigger inverter.

When the buffer circuit 100 operates in the first operation mode and the input signal VIN is at a logic high level, the output signal VOUT may be at a logic low level. When this occurs, the first voltage adjustment circuit 131 may be activated and the second voltage adjustment circuit 132 may be deactivated. The first voltage adjustment circuit 131 may receive the mode signal MODE and may provide the second power supply voltage VSS as the first voltage V1 through the first power selection circuit 131-1, thereby lowering the voltage level of the first voltage V1. When this occurs, the first voltage V1 may be a voltage that determines the LTP of the Schmitt trigger inverter.

In the first operation mode, the output signal VOUT, which has a voltage level that varies between the first voltage V1 and the second voltage V2, may be outputted in response to the input signal VIN. In the first operation mode, the buffer circuit 100 may operate as the Schmitt trigger inverter, adjust a hysteresis width by adjusting the voltage levels of the first voltage V1 and the second voltage V2 according to the logic level of the input signal VIN, and substantially maintain the voltage level of the output signal even though a glitch and/or noise occurs in the input signal VIN, thereby stabilizing the output signal.

When the buffer circuit 100 operates in the second operation mode, the buffer circuit 100 may provide the first power supply voltage VDD and the second power supply voltage VSS as the first voltage V1 and the second voltage V2, respectively, regardless of the logic level of the input signal VIN.

When the buffer circuit 100 operates in the second operation mode, the first voltage adjustment circuit 131 may receive the mode signal MODE and may provide the first power supply voltage VDD as the first voltage V1, and the second voltage adjustment circuit 132 may receive the complementary signal MODEB of the mode signal MODE and may provide the second power supply voltage VSS as the second voltage V2. In the second operation mode, the buffer circuit 100 may operate as a general inverter, provide the first power supply voltage VDD as the first voltage V1, provide the second power supply voltage VSS as the second voltage V2, and substantially maintain the first voltage V1 and the second voltage V2 at the voltage levels of the first power supply voltage VDD and the second power supply voltage VSS, thereby minimizing delay that occurs when the output signal is generated from the input signal VIN.

Figure 2:
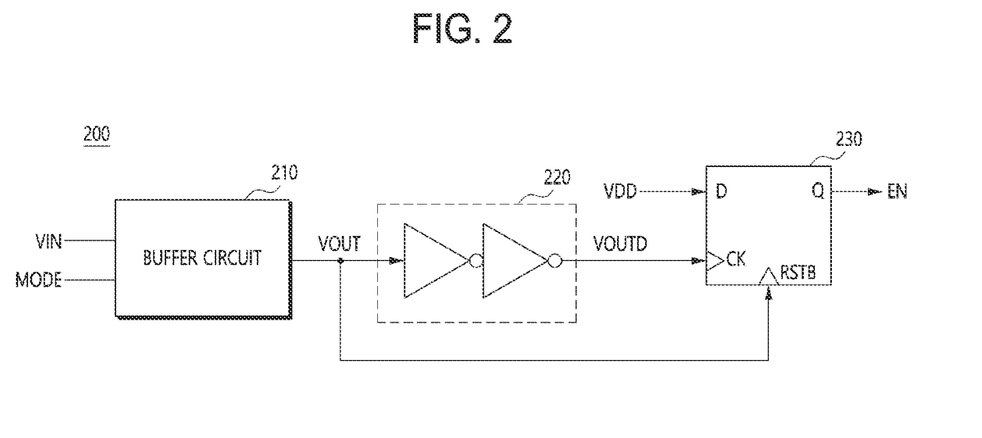
FIG. 2 is a diagram illustrating a configuration of an enable signal generation circuit in accordance with an embodiment of the present disclosure.

FIG. 2 is a diagram illustrating a configuration of an enable signal generation circuit 200 in accordance with an embodiment of the present disclosure. Referring to FIG. 2, the enable signal generation circuit 200 may include a buffer circuit 210, a delay circuit 220, and a trigger circuit 230.

The buffer circuit 210 may receive the input signal VIN and the mode signal MODE and may generate the output signal VOUT. The buffer circuit 100 illustrated in FIG. 1, or a plurality of buffer circuits illustrated in FIG. 4, may be applied to the buffer circuit 210.

The buffer circuit 210 may generate the output signal VOUT, which has a voltage level, which varies between the first voltage V1 and the second voltage V2, based on the input signal VIN. The output signal VOUT may swing between the first voltage V1 and the second voltage V2.

The buffer circuit 210 may adjust the voltage levels of the first voltage V1 and the second voltage V2 based on the input signal VIN and the output signal VOUT in the first operation mode and may substantially maintain the voltage levels of the first voltage V1 and the second voltage V2, regardless of the input signal VIN, in the second operation mode. For example, when the input signal VIN is at a logic high level in the first operation mode, the buffer circuit 210 may provide the second power supply voltage VSS as the first voltage V1, and when this occurs, the second voltage V2 may increase the UTP of the Schmitt trigger inverter.

When the input signal VIN is at a logic low level in the first operation mode, the buffer circuit 210 may provide the first power supply voltage VDD as the second voltage V2. When this occurs, the first voltage V1 may decrease the LTP of the Schmitt trigger inverter.

In the second operation mode, the buffer circuit 210 may provide the first power supply voltage VDD as the first voltage V1, provide the second power supply voltage VSS as the second voltage V2, and substantially maintain the first voltage V1 and the second voltage V2 at the voltage levels of the first power supply voltage VDD and the second power supply voltage VSS, thereby minimizing delay that occurs when the output signal is generated from the input signal VIN.

The delay circuit 220 may receive the output signal VOUT, generate a delayed output signal VOUTD by delaying the output signal VOUT, and provide the delayed output signal VOUTD to the trigger circuit 230. A delay time of the delay circuit 220 may be variously adjusted.

The trigger circuit 230 may generate an enable signal EN based on the output signal VOUT and the delayed output signal VOUTD. For example, the trigger circuit 230 may generate a state in which a logic level of the enable signal EN may be changed based on the output signal VOUT. The trigger circuit 230 may release a reset state of the enable signal EN when the output signal VOUT has been enabled. The trigger circuit 230 may change the voltage level of the enable signal EN based on the delayed output signal VOUTD. The trigger circuit 230 may enable the enable signal EN when the delayed output signal VOUTD has been enabled.

The trigger circuit 230 may include a flip-flop. The flip-flop may receive the power supply voltage VDD through an input terminal D thereof, receive the delayed output signal VOUTD through a clock terminal CK thereof, receive the output signal VOUT through a reset terminal RSTB thereof, and output the enable signal EN through an output terminal Q thereof.

The trigger circuit 230 may reset the enable signal EN when the output signal VOUT has been disabled to a logic low level and may release the reset state of the enable signal EN when the output signal VOUT has been enabled to a logic high level.

When the output signal VOUT has been enabled to a logic high level, the trigger circuit 230 may enable the enable signal EN at a logic high level by outputting the power supply voltage VDD as the enable signal EN if the delayed output signal VOUTD is enabled to a logic high level.

Figure 3:
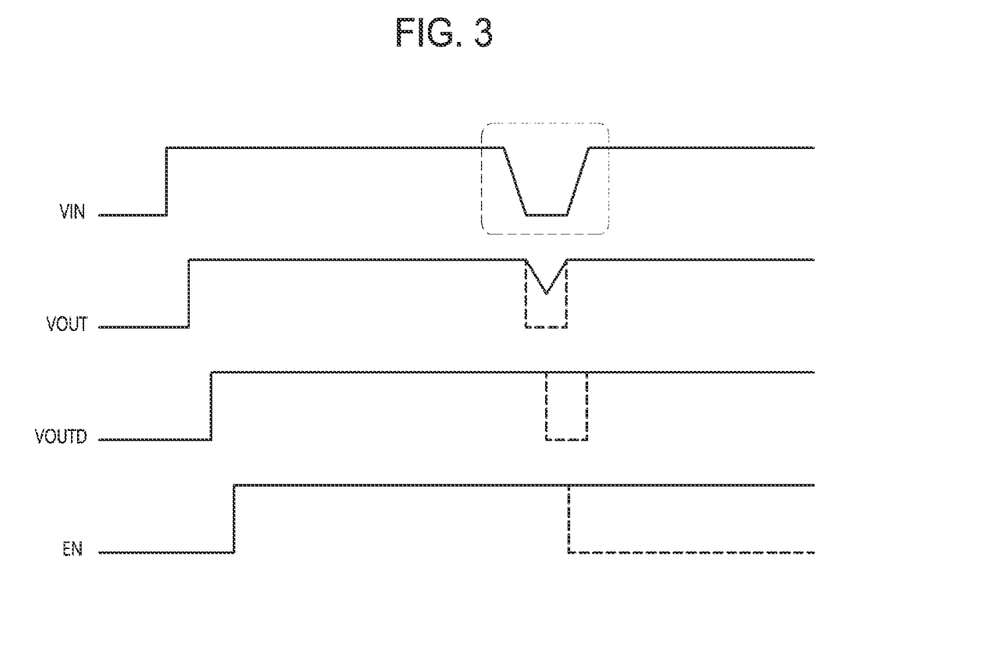
FIG. 3 is a timing diagram illustrating operations of enable signal generation circuits in accordance with an embodiment of the present disclosure.

FIG. 3 is a timing diagram illustrating operations of the enable signal generation circuit 200 and an enable signal generation circuit 300 in accordance with an embodiment of the present disclosure.

Referring to FIG. 3, when the mode signal MODE is disabled, the buffer circuit operates as a general inverter, and when a glitch occurs in the input signal VIN, the glitch of the input signal VIN is applied to the output signal VOUT as is, so that the enable signal EN may be disabled at an undesired timing as indicated by a dotted line. When the mode signal MODE is enabled, the buffer circuit operates as a Schmitt trigger inverter, and even though a glitch occurs in the input signal VIN, an influence on the output signal VOUT due to the glitch is reduced, so that the enable signal EN may be substantially prevented from being disabled at an undesired timing as indicated by a solid line, thereby substantially maintaining the enable state.

Figure 4:
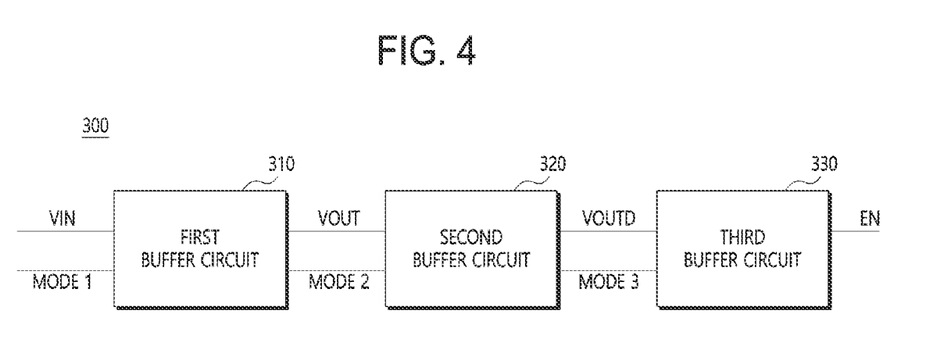
FIG. 4 is a diagram illustrating a configuration of an enable signal generation circuit in accordance with an embodiment of the present disclosure.

FIG. 4 is a diagram illustrating a configuration of the enable signal generation circuit 300 in accordance with an embodiment of the present disclosure. Referring to FIG. 4, the enable signal generation circuit 300 may invert the input signal VIN to generate the output signal VOUT with a voltage level that varies between the first voltage V1 and the second voltage V2 and may invert the output signal VOUT to generate an enable signal EN with a voltage level that varies between the first voltage V1 and the second voltage V2. The enable signal generation circuit 300 may include at least two, that is, a plurality of buffer circuits. The plurality of buffer circuits may generate the enable signal EN by sequentially buffering the input signal VIN.

The enable signal generation circuit 300 may include a first buffer circuit 310, a second buffer circuit 320, and a third buffer circuit 330. The buffer circuit 100 illustrated in FIG. 1 may be applied to each of the first to third buffer circuits 310, 320, and 330. The first third buffer circuits 310, 320, and 330 may have substantially the same configuration except that they receive different mode signals.

The first buffer circuit 310 may generate the output signal VOUT based on the input signal VIN and a first mode signal MODE1. The first buffer circuit 310 may operate in one of the first operation mode and the second operation mode based on the first mode signal MODE1. The first buffer circuit 310 may adjust the voltage levels of the first voltage V1 and the second voltage V2 based on the input signal VIN in the first operation mode, and substantially maintain the voltage levels of the first voltage V1 and the second voltage V2 in the second operation mode.

The second buffer circuit 320 may generate the delayed output signal VOUTD on the basis of the output signal VOUT. The second buffer circuit 320 may adjust the voltage levels of the first voltage V1 and the second voltage V2 on the basis of the output signal VOUT and a second mode signal MODE2 in the first operation mode, and substantially maintain the voltage levels of the first voltage V1 and the second voltage V2 in the second operation mode.

The third buffer circuit 330 may generate the enable signal EN based on the delayed output signal VOUTD and a third mode signal MODE3. The third buffer circuit 330 may adjust the voltage levels of the first voltage V1 and the second voltage V2 based on the delayed output signal VOUTD in the first operation mode and may substantially maintain the voltage levels of the first voltage V1 and the second voltage V2 in the second operation mode.

The enable signal generation circuit 300 may freely adjust the number of buffer circuits, which operate as Schmitt trigger inverters, and the number of buffer circuits, which operate as general inverters, according to the first to third mode signals MODE1 to MODE3. As a mode signal enabled among the first to third mode signals MODE1 to MODE3 is increased, it is possible to substantially maintain an enable level more stably regardless of a glitch and noise.

The present disclosure may be carried out in other specific forms without changing its technical spirit or essential features. Therefore, a person skilled in the art to which the present disclosure pertains should understand that the embodiments described above are illustrative in all respects, not limitative. The scope of the present disclosure is defined by the claims to be described below rather than the detailed description, and it should be construed that the meaning and scope of the claims and all modifications or modified forms derived from the equivalent concept thereof are included in the scope of the present disclosure.

What is claimed is:

1. An enable signal generation circuit comprising:
   a buffer circuit configured to invert an input signal to generate an output signal with a voltage level that varies between a first voltage and a second voltage different from the first voltage, configured to adjust voltage levels of the first voltage and the second voltage based on the input signal and the output signal in a first operation mode, and configured to maintain the voltage levels of the first voltage and the second voltage in a second operation mode;
   a delay circuit configured to delay the output signal and generate a delayed output signal; and
   a trigger circuit configured to generate an enable signal based on the output signal and the delayed output signal.

2. The enable signal generation circuit according to claim 1, wherein the trigger circuit releases a reset state of the enable signal based on the output signal, and enables the enable signal based on the delayed output signal.

3. An enable signal generation circuit comprising:
   a first buffer circuit configured to invert an input signal to generate an output signal with a voltage level that varies between a first voltage and a second voltage different from the first voltage, to adjust voltage levels of the first voltage and the second voltage based on the input signal and the output signal in a first operation mode, and to maintain the voltage levels of the first voltage and the second voltage in a second operation mode; and
   a second buffer circuit configured to invert the output signal to generate an enable signal with a voltage level that varies between the first voltage and the second voltage, configured to adjust the voltage levels of the first voltage and the second voltage based on the output signal and the enable signal in the first operation mode, and configured to maintain the voltage levels of the first voltage and the second voltage in the second operation mode.

4. The enable signal generation circuit according to claim 3, wherein the first buffer circuit comprises:
   a power control circuit configured to provide the first voltage and the second voltage based on the input signal and a first mode signal;
   an inverting circuit configured to receive the first voltage and the second voltage and configured to invert the input signal to generate the output signal; and a voltage adjustment circuit configured to adjust the voltage levels of the first voltage and the second voltage based on the first mode signal and the output signal.

5. The enable signal generation circuit according to claim 4, wherein the second buffer circuit comprises:
a power control circuit configured to provide the first voltage and the second voltage based on the output signal and a second mode signal;
an inverting circuit configured to receive the first voltage and the second voltage and configured to invert the output signal to generate the enable signal; and
a voltage adjustment circuit configured to adjust the voltage levels of the first voltage and the second voltage based on the second mode signal and the enable signal.

* * * * *